United States Patent [19]

Durkin et al.

[11] Patent Number: 5,128,967
[45] Date of Patent: Jul. 7, 1992

[54] SYMBOL STATE TRELLIS MAXIMUM LIKELIHOOD DETECTION METHOD

[75] Inventors: Michael F. Durkin, Scottsdale; James H. Stilwell, Mesa; Russell D. Thomas, Chandler, all of Ariz.

[73] Assignee: Motorola, Inc., Schaumburg, Ill.

[21] Appl. No.: 383,683

[22] Filed: Jul. 24, 1989

[51] Int. Cl.$^5$ .......................................... H04L 27/22
[52] U.S. Cl. ...................................... 375/83; 371/43; 329/304
[58] Field of Search ...................... 375/17, 37, 39, 53, 375/57, 58, 83, 85; 371/43, 44, 45; 329/304

[56] References Cited

U.S. PATENT DOCUMENTS

| | | | |
|---|---|---|---|
| 4,545,054 | 10/1985 | Davis | 371/43 |
| 4,641,327 | 2/1987 | Wei | 375/38 |
| 4,709,377 | 11/1987 | Martinez et al. | 371/43 |
| 4,713,829 | 12/1987 | Eyuboglu | 375/37 |
| 4,748,626 | 5/1988 | Wong | 375/17 |
| 4,862,481 | 8/1989 | Dzung | 371/43 |
| 4,868,830 | 9/1989 | Pollara-Bozzola | 371/43 |

OTHER PUBLICATIONS

Simmons et al., "Low Complexity Decoders for Bandwidth Efficient Digital Phase Modulation" Queens University, Kingston Ontario, Canada, 1982, IEEE pp. 1126–1130.
Aulin et al., "CPM—An Efficient Constant Amplitude Modulation Scheme" International Journal of Satellite Communications John Wiley, vol. 2, 161–186 (1984).
Aulin et al., "Viterbi Detectors with Reduced Complexity for Partial Response Continuous Phase Modulation" Arne Svensson of University of Lund IEEE 1981.
Sundberg, "Continuous Phase Modulation" IEEE Communication Magazine vol. 24, No. 4 Apr. 1986.
Eyuboglu et al., "Reduced-State Estimation with Set Partition and Decision Feedback" IEEE Transactions on Communication vol. 30, No. 1 Jan. 1988.
Eyuboglu et al., "Reduced-State Sequence Estimation for Trellis Coded Modulation on Intersymol Interference Channel".
Eyuboglu et al., "Reduced-State Sequence Estimation with Set Partitioning and Decision Feedback" IEEE 1986, pp. 1023–1028.

Primary Examiner—Stephen Chin
Attorney, Agent, or Firm—Frank J. Bogacz

[57] ABSTRACT

A symbol state trellis maximum likelihood detection method greatly limits the number of possible interfering symbols which require examination. This method has considerable processing advantages over other optimal maximum likelihood detection methods. For practical configurations, the symbol state trellis maximum likelihood detection method provides a performance which is less than 1 dB from the optimal maximum likelihood detection method while simultaneously providing for a similar bit error rate. The symbol state trellis maximum likelihood detection method calculates the phase errors for all paths from a present state to a previous state. Next, total path distances are calculated for previously selected paths to the previous state. The phase error associated with each of the paths from two states previous to the present state are calculated. For each symbol of the present state, only one path is selected to each symbol. This path corresponds to the path with the minimum phase error. The symbol sent may then be determined by retracing the selected paths through the trellis structure for each of the M symbols.

19 Claims, 6 Drawing Sheets

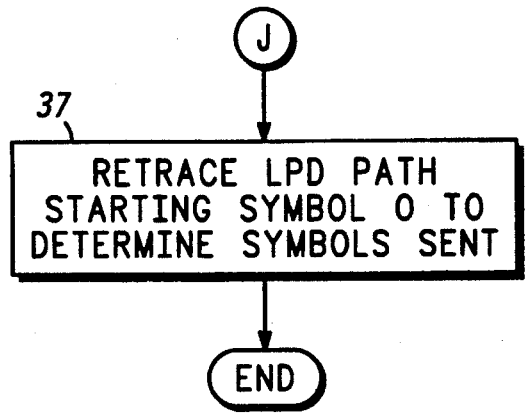
*FIG. 1E*
*FIG. 2*
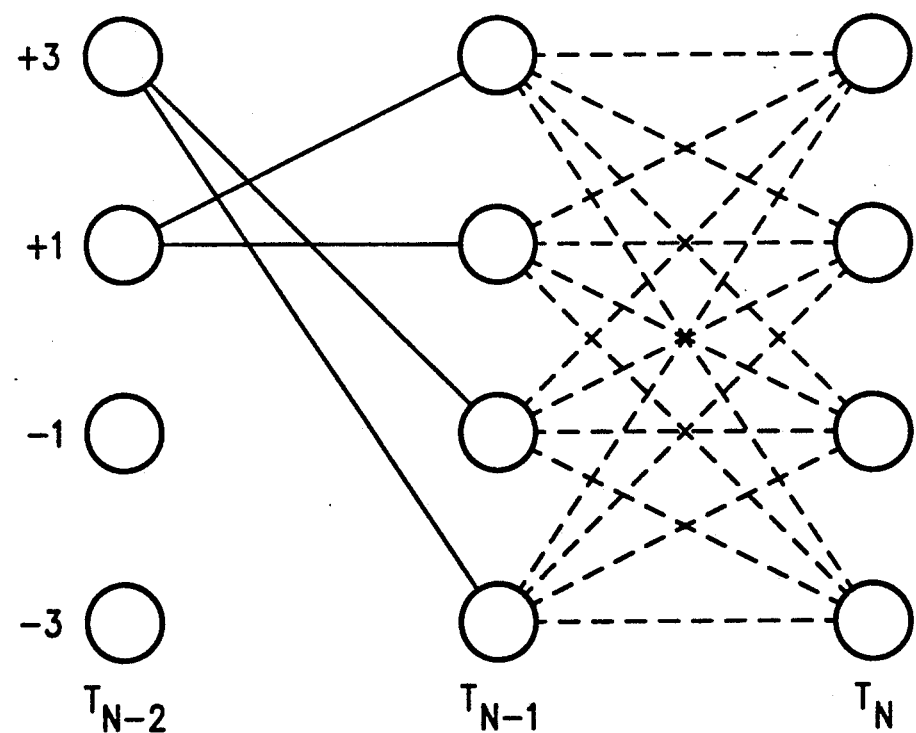
EXAMPLE PATHS FOR M=4 AND L=3

SYMBOL STATE TRELLIS MAXIMUM LIKELIHOOD DETECTION METHOD

BACKGROUND OF THE INVENTION

The present invention pertains to demodulation of high speed data and more particularly to a method for continuous phase demodulation of high speed data represented by symbol sequences which contain intersymbol interference.

In modern day communications, it is desirable to achieve high data transmission rates. Further, it is desirable to achieve a 64 KBPS time division multiple access (TDMA) burst rate over a 25 KHZ UHF satellite channel, for example. Increased use of UHF satellite channels is necessary to support the increasing demand for data in the limited radio frequency (RF) spectrum. High speed data transmitted in this manner is modulated by a transmitting device and demodulated by the receiving device.

Modulation/Demodulation methods limit the amount of data throughput which may be transmitted and received. In addition, different modulation types provide different bit error rates depending on the data transmission speed of the channel. Some commonly found modulation schemes are MSK, BPSK, QPSK and CPM.

Among these modulation methods, CPM (continuous phase modulation) is best suited to achieve a high bit rate per hertz modulation/demodulation system. MSK, BPSK and QPSK are orthogonal modulation/demodulation systems. This means that they have an L=1. L is the intersymbol interference (that is, how far back in time you must go before previous symbols have no affect on the output). Modulation/demodulation systems with larger L (intersymbol interference) tend to present a higher bit error rate (BER) in their performance.

Accordingly, it is an object of the present invention to provide a symbol state trellis maximum likelihood detection method for use with continuous phase demodulation which achieves a high bit transfer rate per hertz and a relatively low bit error rate (BER) regardless of the amount of intersymbol interference.

SUMMARY OF THE INVENTION

In accomplishing the object of the present invention, a novel symbol state trellis maximum likelihood detection method is shown.

A continuous phase modulation (CPM) system has M symbols and an intersymbol interference of L. The symbol state trellis maximum likelihood detection method greatly limits the number of interfering symbols which are required to be examined for symbol transitions from time period-to-time period.

The symbol state trellis maximum likelihood detection method first determines the Euclidean branch distances for a plurality of M symbols. These branch distances are determined from a present time period $T_N$ to a previous time period $T_{N-1}$ for each of the M symbols. Next, the method determines an error of total Euclidean path distances corresponding to each of the Euclidean branch distances. Again, this is performed for each of the plurality of M symbols from the time period $T_N$ to the previous time period $T_{N-1}$.

One particular path from time period $T_{N-1}$ to each of the symbols at time period $T_N$ is saved. The particular path which is saved is the path corresponding to the minimum error of the total Euclidean path distance. Each of the path distances which possibly produce a symbol at the previous time period $T_{N-1}$ are examined. Lastly, the received symbols are detected by retracing the Euclidean path distances corresponding to the minimum error for M time periods from the symbol at the present time period $T_N$.

The above and other objects, features, and advantages of the present invention will be better understood from the following detailed description taken in conjunction with the accompanying drawings.

BRIEF DESCRIPTION OF THE DRAWINGS

FIGS. 1A-1E are flow charts of the method embodying the present invention.

FIG. 2 is trellis diagram example depicting the present invention.

DESCRIPTION OF THE PREFERRED EMBODIMENT

Figure 1A:
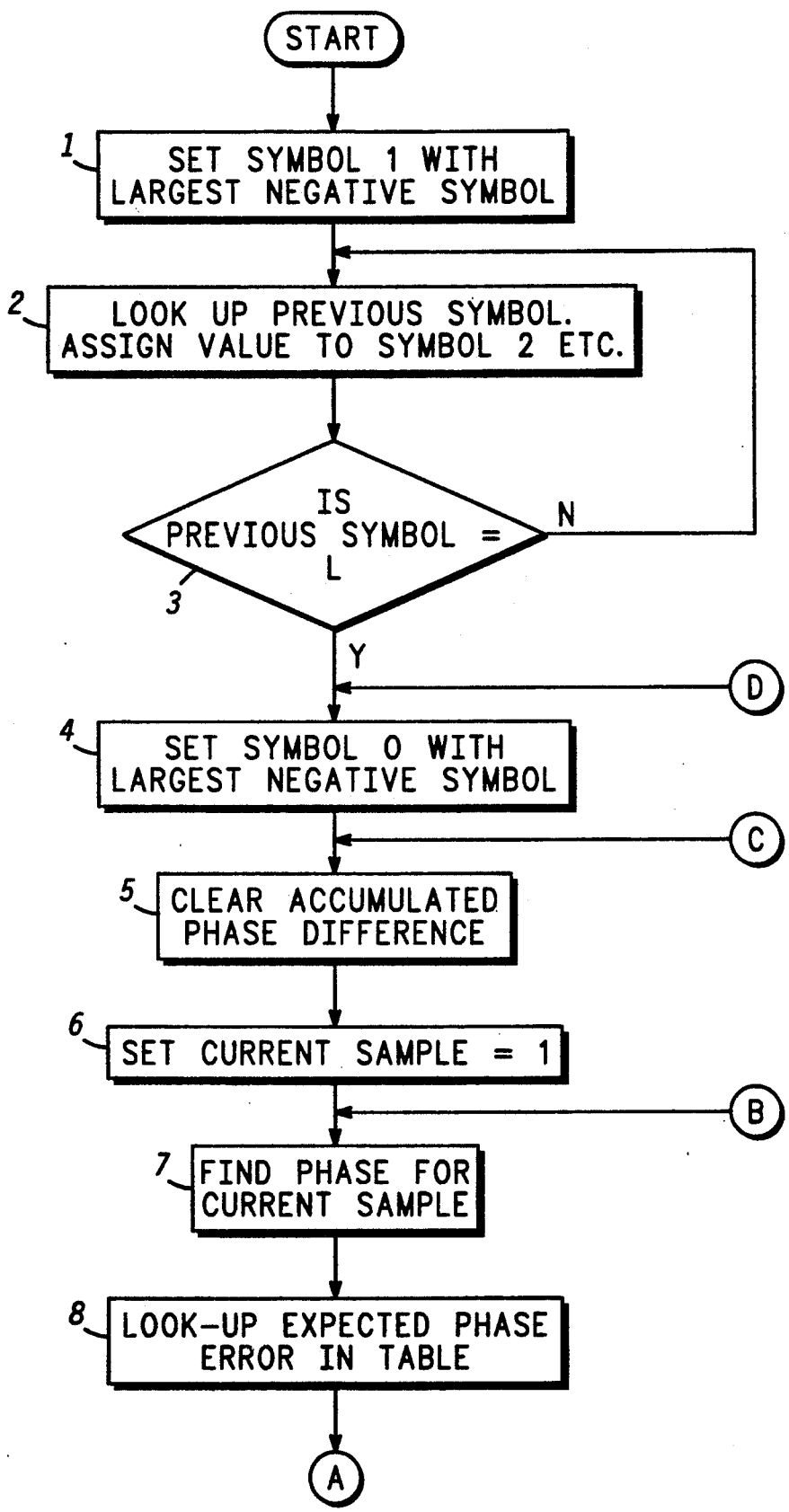
Figure 1B:
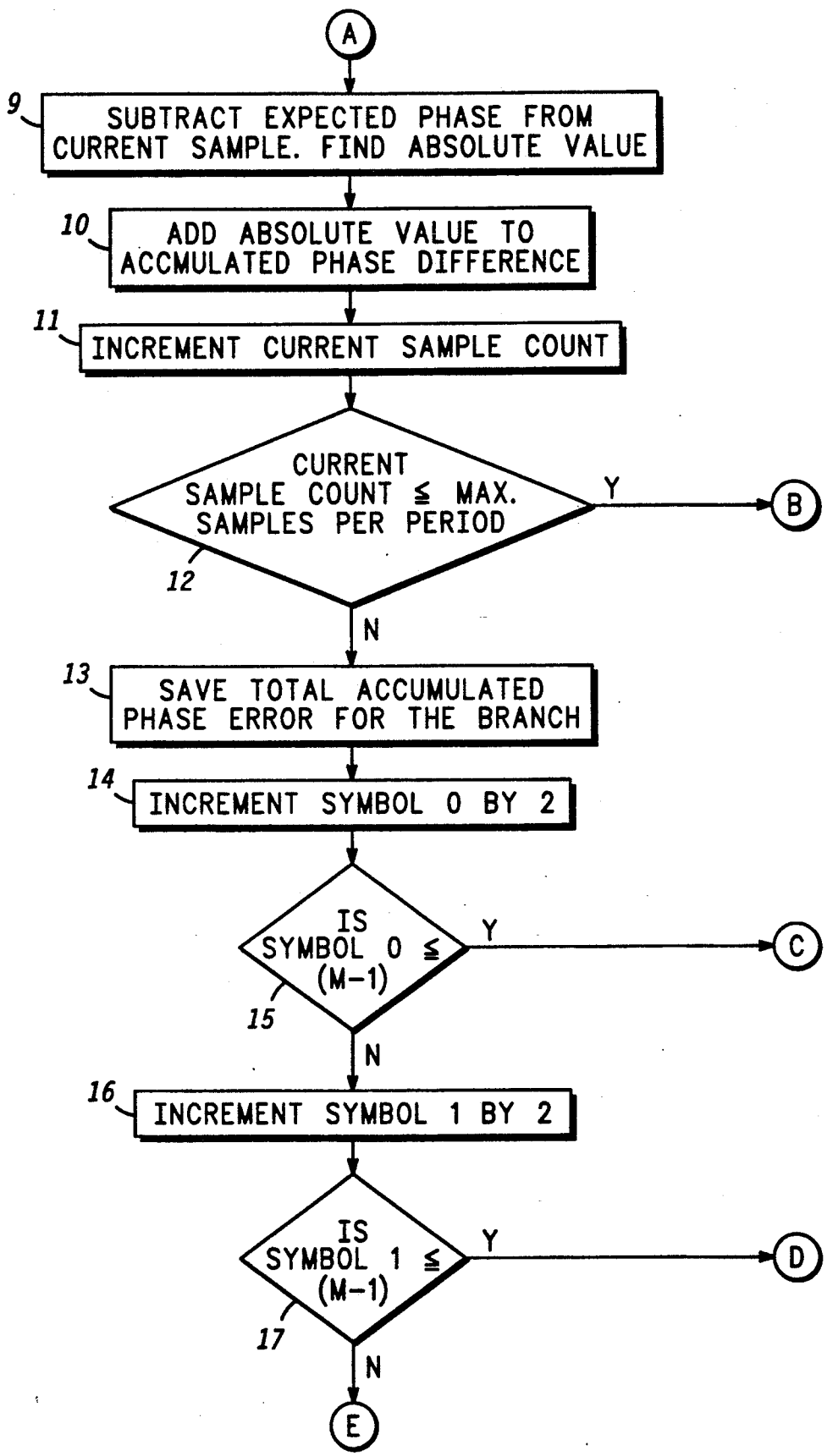
Figure 1C:
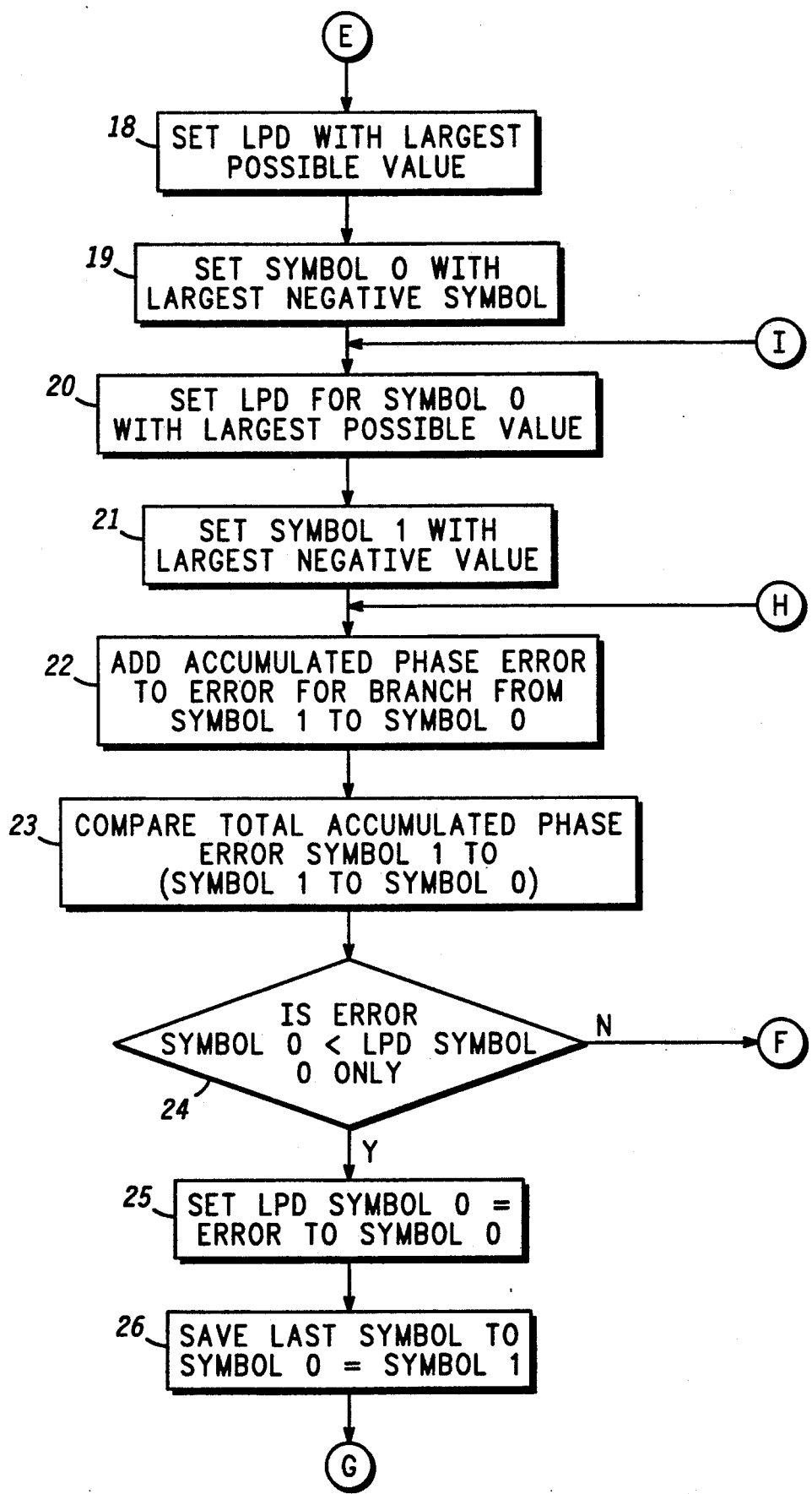
Figure 1D:
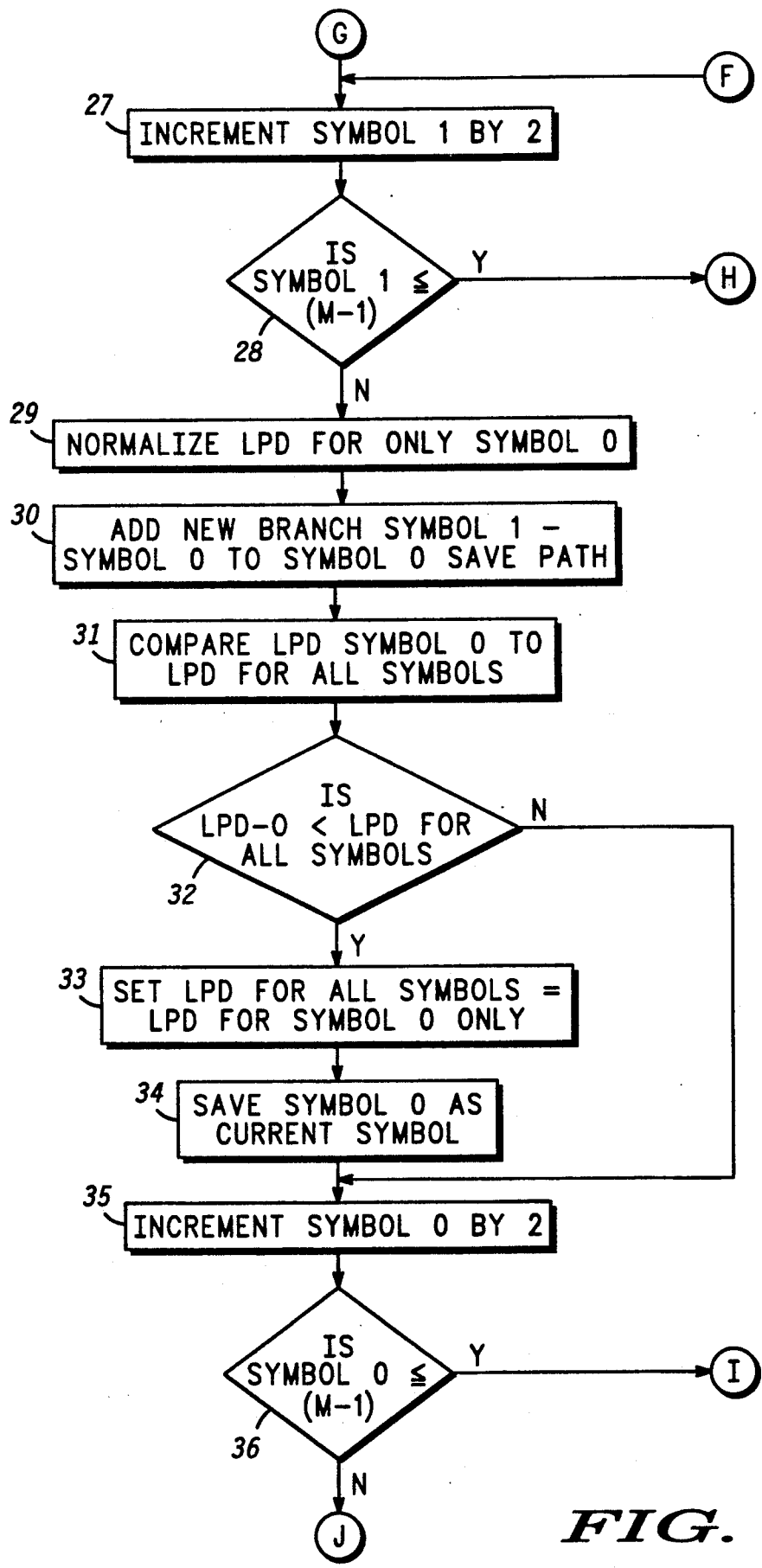

In modulation/demodulation systems, L is the intersymbol interference as mentioned above. M is the number of symbol types which can be transmitted for the particular modulation/demodulation scheme. For the special case of continuous phase modulation (CPM), M equals the number symbols possible. H is the modulation index. A modulation index of one-half is equal to 90 degrees.

As M increases, the signal-to-noise ratio improves. This relationship obtains since for more symbol types, a slower integration process is performed.

Optimal maximum likelihood detection methods require a high clock speed. This high clock speed required fast acting hardware. Such fast acting hardware is not in existence at the present time. Therefore, the clock speed of the maximum likelihood detection method had to be reduced in order to build a practical implementation.

Accordingly, the present symbol state trellis maximum likelihood detection method was devised. The primary advantage of the symbol state trellis maximum likelihood detection method over the optimal maximum likelihood detection method, described above, is that substantial processing time is eliminated by limiting the number of possible interfering symbols which have to be examined by defining the trellis states as symbols sent rather than phase vectors.

Generally, the symbol state trellis maximum likelihood detection method calculates or determines the Euclidean branch distances corresponding to the phase errors for all symbols at time period $T_N$ from previous time period $T_{N-1}$. Next, the total Euclidean path distances are determined for each symbol. Lastly, only one minimal path distance for each symbol is kept for each symbol. Symbols received may be determined by tracing the trellis back the required number of time periods.

FIGS. 1A-1E depict the symbol state trellis maximum likelihood detection method of the present invention. FIG. 2 depicts a symbol state trellis produced by the symbol state trellis maximum likelihood detection method. FIG. 2 is an example of a symbol state trellis according to the present invention, as mentioned above. M is the number symbols.

The M bits of this example are represented by the numbers: $-3$, $-1$, $1$ and $3$. These symbols are shown at the left of FIG. 2. Along the horizontal axis is shown the time periods. The time periods are $T_N$, $T_{N-1}$ and $T_{N-2}$. The time period $T_N$ is the present time period. The time period $T_{N-1}$ is the previous time period or the time period preceding $T_N$. The time period $T_{N-2}$ is two time periods preceding $T_N$ or one time period preceding $T_{N-1}$. For the transitions from time period $T_{N-2}$ to $T_{N-1}$, the paths which have been selected by the method are shown in solid lines. That is, time period $T_{N-1}$ each of the four symbols ($-3$, $-1$, $1$ and $3$) are entered by only one branch path from a symbol state at time period $T_{N-2}$. These four paths are as follows. Symbol 3 at time $T_{N-2}$ has a path to symbols $-1$ and $-3$ at time $T_{N-1}$. Symbol 1 at $T_{N-2}$ has a path to symbols 3 and 1 at time period $T_{N-1}$. By application of the symbol state trellis maximum likelihood detection method, all other paths have been removed (or pruned) from the trellis. As a result, these four paths are the most likely paths taken from time period $T_{N-2}$ to $T_{N-1}$.

The dashed lines in FIG. 2 from each symbol of time period $T_{N-1}$ to each symbol of time period $T_N$ represent the paths from $T_{N-1}$ to $T_N$. These are all possible paths taken in the trellis from time period $T_{N-1}$ to time period $T_N$. These are the paths which will be examined in order to determine the four most likely transitions from time period $T_{N-1}$ to time period $T_N$ (one transition for each symbol). After application of the symbol state trellis maximum likelihood detection method, the branches from time period $T_{N-1}$ to $T_N$ will appear similar to the branches for transfer from time period $T_{N-2}$ to time period $T_{N-1}$. That is, there will be one branch entering each symbol state at time period $T_N$ from a particular symbol at time period $T_{N-1}$.

Accordingly, the symbol state trellis maximum likelihood detection method will now be described with reference to FIGS. 1A–1E. The symbol state trellis maximum likelihood detection method is initiated at the START block. Again, it is to be remembered that for the present purposes of explanation, M, the number of symbols which can be sent, is equal to 4. L, the number of time periods which must be retraced in order to avoid any intersymbol interference is equal to 3 and H, the modulation index, is equal to $\frac{1}{2}$.

First, symbol 1 is set with the largest negative symbol value, block 1. The largest positive symbol value could have been selected as the starting point as well. The symbol values could be selected in any order, but contiguous selection makes for a simpler implementation. Again, for the present example of M equals 4, there are four symbols ($-3$, $-1$, $1$ and $3$). This step selects the value for symbol 1 which is a particular symbol during time period $T_{N-1}$ as being equal to the symbol $-3$. The four symbols selected for the condition M equals 4 are separated by two integers from the preceding symbol. Symbol 0 hereinafter will represent a symbol during the present time period $T_N$. Symbol 1 will represent a symbol at one time period previous or $T_{N-1}$. Symbol 2 will represent a symbol at two time periods previous or $T_{N-2}$.

Next, block 2 looks up the value of the previous symbol to symbol 1 and assigns that value to symbol 2 or other symbols as required. For the symbol $-3$ at time period $T_{N-1}$ only one other symbol has a branch to that symbol. That is, at time $T_{N-2}$ only symbol 3 has a branch to symbol $-3$ at time period $T_{N-1}$. Block 3 determines whether the time of the previous symbol is equal to L time periods. L is the intersymbol interference. For L=1 or 2, symbol 2 does not need to be initialized. In this case, L is equal to 3, so, we must look back one more time period to determine the value for symbol 2. If L=4, symbol 2 and symbol 3 are initialized, block 3 iterates block 2 twice. If L=5, symbol 2, symbol 3 and symbol 4 are initialized, block 2 is iterated 3 times, etc. If the time of the previous symbol is less than L, the N path will be followed from block 3 to block 2 and block 2 will iterate this process. If block 3 determines that this time the previous symbol time is equal to L, the Y path will be followed to block 4. In the above manner, previous symbols are looked-up depending upon the value of L, block 2 will be iterated a number of times depending on L.

Then, symbol 0, the symbol at time period $T_N$, is set with the largest negative symbol value, block 4. For M equal to 4, this symbol value is $-3$. Next, the accumulated phase difference or error is cleared, block 5.

Block 6 sets the current sample equal to the first sample. The current phase error for a path from $-3$ at $T_{N-1}$ to $-3$ at $T_N$ is found, block 7. Next, a table lookup is performed for the phase error related to symbol 2, symbol 1 and symbol 0, block 8. This is the expected phase or error for the given symbols.

Then, block 9 subtracts the expected phase error from the current sample phase error and takes the absolute value of this difference. Taking the absolute value helps to eliminate additional error. Next, the absolute value is added to the accumulated phase difference, block 10.

The current sample count is incremented, block 11. Block 12 determines whether the current sample count is less than or equal to the maximum number of samples per period. If this determination is answered in the affirmative, block 12 transfers control to block 7 to iterate the abovementioned process. The current sample count is the number of samples taken per period. If more samples per period are taken less error is produced. However, each sample must be processed. As more samples are taken, greater processing time is required. It was determined empirically that four samples per period achieves a reasonable amount of accuracy while keeping processing time to a minimum. If all the samples per period have been collected, the N path is followed from block 12 to block 13. If all sample have not been collected, the Y path is followed and the process is iterated from block 7.

The total accumulated phase error for the particular branch has been saved, block 13. Next, the value of symbol 0 is incremented by 2, block 14. This accounts for the two-integer spacing between symbols. That is, the symbols consist of $-3$, $-1$, 1 and 3. By incrementing symbol 0 by 2, we move from the symbol $-3$ to symbol $-1$, for example. Next, block 15 determines whether symbol 0 is less than or equal to M$-$1. In this case, M is equal to 4. M$-$1 is equal to 3. Therefore, symbol 0 is tested for being less than or equal to 3. As an example, since we started at $-3$ and increment by 2 each time, the sequence of numbers assigned to symbol 0 will be $-3$, $-1$, 1 and 3. Since, in this particular example, smybol 0 is now at $-1$ and that is less than or equal to M$-$1, the Y path will be taken from block 15 and transfer will be made to block 5 where the above-mentioned process will be iterated from that point. As can be seen by the above, since symbol 0 is incremented by 2 each time, the method first starts by examining the paths into the symbol $-3$ at time period $T_N$. Next, the symbol $-1$ at time period $T_N$ is examined for all branch paths entering it; then the symbol 1 at time period $T_N$ is examined; and finally the symbol 3 at time period $T_N$ is examined.

Next, symbol 1, which is the symbol under consideration during time period $T_{N-1}$, is incremented by 2, block 16. Block 17 determines whether symbol 1 is less than or equal to $M-1$. Since, for this example, M is 4, $M-1$ is 3. Similar to that for symbol 0 above, symbol 1 is initially set at $-3$, then $-1$, then 1 and finally $+3$. If symbol 1 is less than or equal to $M-1$, the Y path is followed from block 17 to block 4 where the above-mentioned method is iterated beginning at that point. If symbol 1 is greater than $M-1$, the N path will be followed from block 17 to block 18.

As a result, the first major portion of the symbol state trellis maximum likelihood detection method is finished. The initial step in this method has calculated the Euclidean branch distances for each of the symbols from $T_{N-1}$ to $T_N$.

The next major step of the method calculates the total Euclidean path distances between symbols at time period $T_{N-1}$ and $T_N$.

Block 18 sets the lowest path distance (LPD) with the largest possible value. This is an initialization. Since this value will be constantly compared, it is necessary that the value be a non-zero value for the initial comparison. As a result, any very large value which the processor of this method is capable of storing is the preferred value. Symbol 0 is set with the largest negative symbol value, block 19. In this example of M equal 4, the largest negative symbol value is $-3$. Next, the lowest path distance (LPD) for symbol 0 only is set with the largest allowable value as mentioned above, block 20. Block 21 sets symbol 1 with the largest negative value, $-3$.

Next, the total accumulated phase error for the path to symbol 1, in the present example $-3$, is added to the accumulated phase error for a particular branch from symbol 1 to symbol 0, for this particular example of the symbol $-3$, block 22. Next, the total accumulated phase error for the path to symbol 0 is compared to the lowest path distance (LPD) for symbol 0 only, block 23. If the total accumulated phase error for the path to symbol 0 is less than the LPD for symbol 0 only, transfer is made from block 24 via the Y path to block 25. Otherwise, block 24 transfers control to block 27 via the N path, thereby omitting the steps of blocks 25 and 26.

Block 25 sets the lowest path distance for symbol 0 only with the total accumulated phase error for the path to symbol 0. Then, the previous symbol to symbol 0 is stored for use by block 2 during the next symbol time $T_{N+1}$, block 26. Block 27 increments the value of symbol 1 by 2. In the present example, since $-3$ was the first symbol chosen for symbol 1, the incremented symbol would equal $-1$. Block 28 determines whether the value or symbol 1 is less than or equal to $M-1$. Since in this example M is equal to 4, $M-1$ is equal to 3. Therefore, this iteration will proceed starting at $-3$; next $-1$; then, 1 and finally 3. If symbol 1 is less than or equal to $M-1$, block 28 transfers control path to block 22 where the above process is iterated. If symbol 1 is greater than $M-1$, block 28 transfers control to block 29.

Next, the LPDs for only symbol 0 are normalized to the value of the smallest LPD from $T_{N-1}$, block 29. This normalization means that the value of the smallest LPD is subtracted from each of the other LPDs. Thereby, the relative differences in magnitudes are kept and overflow of these indicators is prevented.

Block 30 adds the new branch from symbol 1 to symbol 0 to the path of symbol 1. Thus, the distance and the path indication of the minimum path are saved. The lowest path distance (LPD) for symbol 0 only is compared to the LPD for all symbols, block 31. Thus, the path with the least error is found. If the LPD for symbol 0 only is less than the LPD for all symbols, block 32 transfers control to block 33 via the Y path. If the LPD for symbol 0 only is equal to or greater than the LPD for all symbols, then block 32 transfers control to block 35 via the N path, thereby omitting the steps of blocks 33 and 34.

Block 33 sets the LPD for all symbols equal to the LPD for symbol 0 only, since this is the smallest detected error. Next, block 34 saves symbol 0 as the current symbol which corresponds to the lowest path distance.

Symbol 0 is incremented by 2, block 35. Block 36 determines whether the value of symbol 0 is less than or equal to $M-1$. Since for this example M is equal to 4, $M-1$ equals 3. The above procedure will be repeated for each of the symbol values $-3$, $-1$, 1 and 3. Since for this particular case the value of symbol 0 is now $-1$, $-1$ is less than $M-1$, therefore block 36 transfers control via the Y path to block 20 where the above steps are iterated. When the value of symbol 0 is greater than $M-1$, block 36 transfers control via the N path to block 37.

The last major step of the symbol state trellis maximum likelihood detection method is to retrace the path back through the trellis using the lowest path distance paths starting with the symbol 0 most recently saved, block 37. Lastly, the process is terminated at the END block.

For values of L greater than or equal to 3, the symbol state trellis maximum likelihood detection method takes no longer to execute than for the L equal 2 processing case. For values of L which are quite large, there will be a truncation of interfering symbol possibilities. This may significantly degrade performance of this method. However, for values of L in the neighborhood of L equal 3, the performance of the symbol state trellis maximum likelihood detector is less than 1 dB worse than the optimal maximum likelihood receiver and has a similar bit error rate of approximately $10^{-5}$.

Application of the symbol state trellis maximum likelihood detection method described herein produces a great simplification in the number of states which must be examined for each symbol. For the case of L equal 3, M equal 8, and H equal $\frac{1}{4}$, the symbol state trellis maximum likelihood detection method was able to achieved a 32 to 1 reduction in the required clock speed over the optimal maximum likelihood detection method. The optimal maximum likelihood detection method requires a clock speed of 423 Megahertz in comparison to the clock speed of the symbol state trellis maximum likelihood detector of 13.2 Megahertz. As can be seen, hardware which operates at a clock speed of 423 megahertz is at present infeasible. A hardware clock speed of 13.2 megahertz is a practical goal with present technology.

Table 1 below depicts the number of states resulting from the optimal maximum likelihood detection method for each of the values of L from 1 to 4, values of M from 2 to 16 and of H from $\frac{1}{2}$ to 1/16.

TABLE 1

| | | L | | | |
|---|---|---|---|---|---|
| h | M | 1 | 2 | 3 | 4 |
| 0.5 | 2 | 4 | 8 | 16 | 32 |
| 0.25 | 4 | 8 | 32 | 128 | 512 |

TABLE 1-continued

| h | M | L=1 | L=2 | L=3 | L=4 |
|---|---|---|---|---|---|
| 0.125 | 8 | 16 | 128 | 1024 | 8192 |
| 0.0625 | 16 | 32 | 512 | 8192 | 131072 |

Table 2 depicts the relative improvement in the number of states to be checked of the symbol state trellis maximum likelihood detection method of the present invention as compared to the optimal maximum likelihood detection method.

TABLE 2

| h | M | L=1 | L=2 | L=3 | L=4 |
|---|---|---|---|---|---|
| 0.5 | 2 | 2 | 4 | 8 | 16 |
| 0.25 | 4 | 2 | 8 | 32 | 128 |
| 0.125 | 8 | 2 | 16 | 128 | 1024 |
| 0.0625 | 16 | 2 | 32 | 512 | 8192 |

As can be seen from the above, the symbol state trellis maximum likelihood detection method greatly improves the performance over the maximum likelihood detection method. At the same time, there is little or no degradation in the bit error rate (BER) due to the symbol state trellis maximum likelihood detection method from the optimal method for large signal-to-noise ratios.

Figure 3:
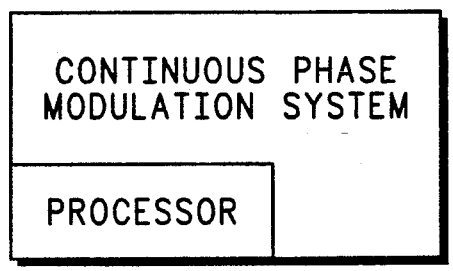
FIG. 3 is a block diagram of a continuous phase modulation system including a processor.

The present invention may be implemented as software on a general purpose microprocessor as a part of a continuous phase modulation system as shown in FIG. 3. Such implementation may stress the limits of conventional microprocessors. A better implementation would be on a digital signal processor. These digital signal processors may be such as those manufactured by Texas Instruments or Motorola, Inc.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. In a continuous phase modulation (CPM) system having M symbols and an intersymbol interference of L, a symbol state trellis maximum likelihood detection method for limiting the number of interfering symbols which are required for examination, said symbol state trellis maximum likelihood detection method comprising the steps of:
   determining Euclidean branch distances for a plurality of M symbols from a present time period $T_N$ to said plurality of M symbols at a previous time period $T_{N-1}$;
   determining an error of total Euclidean path distances corresponding to each of said Euclidean branch distances for said plurality of M symbols from said present time period $T_N$ to said previous time period $T_{N-1}$;
   saving a particular path to each of said plurality of M symbols at time period $T_N$ from time period $T_{N-1}$, each of said particular paths corresponding to a minimum error of said total Euclidean path distances; and
   detecting symbols received by retracing said Euclidean path distances corresponding to said minimum error for M time periods from said symbol at time period $T_N$ having said minimum error.

2. A symbol state trellis maximum likelihood detection method as claimed in claim 1, wherein said step of determining Euclidean branch distances includes the step of setting symbol 1, a symbol at time period $T_{N-1}$, with an initial symbol value of said plurality of M symbols.

3. A symbol state trellis maximum likelihood detection method as claimed in claim 2, wherein said step of determining Euclidean branch distances further includes the steps of:
   looking-up a value of previously stored symbols prior to symbol 1;
   setting symbol N (for N greater than or equal to 2) equal to said value; and
   iterating said steps of looking-up and setting for L time periods.

4. A symbol state trellis maximum likelihood detection method as claimed in claim 3, wherein said step of determining Euclidean branch distances further includes the step of setting symbol 0 with said initial symbol value of said plurality of M symbols.

5. A symbol state trellis maximum likelihood detection method as claimed in claim 4, wherein said step of determining Euclidean branch distances further includes the step of:
   clearing an accumulated phase indicator; and
   setting an indication of a current sample to be that of a first sample.

6. A symbol state trellis maximum likelihood detection method as claimed in claim 5, wherein said step of determining Euclidean branch distances further includes the steps of:
   finding a received phase for said current sample;
   looking-up an expected phase for said current sample;
   subtracting said expected phase from said phase of said current sample to produce a difference;
   determining the absolute value of said difference of said expected phase from said phase of said sample; and
   adding said absolute value to said accumulated phase indicator to produce an accumulated phase error.

7. A symbol state trellis maximum likelihood detection method as claimed in claim 6, wherein said step of determining Euclidean branch distances further includes the steps of:
   incrementing a current sample count indicator;
   determining whether said current sample count indicator is less than or equal to a predetermined maximum sample counts per period; and
   iterating said steps of claims 6 and 7, where said current sample count indicator is less than or equal to said predetermined maximum.

8. A symbol state trellis maximum likelihood detection method as claimed in claim 7, wherein said step of determining Euclidean branch distances further includes the steps of:
   saving said accumulated phase error for each of said branch distances to symbol 0;
   incrementing or decrementing said value of symbol 0 by a predefined number, so that the value of symbol 0 corresponds to a next sequential symbol of said plurality of M symbols;
   determining whether said value of symbol 0 is less than or equal to $M-1$ (greater than or equal to $-(M-1)$; and
   iterating said steps of claims 5 through 8, when said value of symbol 0 is less than or equal to $M-1$.

9. A symbol state trellis maximum likelihood detection method as claimed in claim 8, wherein said step of determining Euclidean branch distances further includes the steps of:

incrementing or decrementing said value of symbol 1 by said predefined number, so that the value of symbol 1 corresponds to said next sequential symbol of said plurality of M symbols;

determining whether said value of symbol 1 is less than or equal to $M-1$ (greater than or equal to $-(M-1)$; and iterating said steps of claims 4 through 9, when said value of symbol 1 is less than or equal to $M-1$.

10. A symbol state trellis maximum likelihood detection method as claimed in claim 9, wherein said step of determining an error of total Euclidean path distances includes the steps of:

setting a lowest path distance indicator for all symbols with a predetermined largest possible value; and setting said value of symbol 0 with said value of the largest negative symbol of said plurality of M symbols.

11. A symbol state trellis maximum likelihood detection method as claimed in claim 10, wherein said step of determining an error of total Euclidean path distances further includes the steps of:

setting a lowest path distance indicator for symbol 0 only with said largest possible value; and setting the value of symbol 1 with said value of the largest negative symbol of said plurality of M symbols.

12. A symbol state trellis maximum likelihood detection method as claimed in claim 11, wherein said step of determining an error of total Euclidean path distances further includes the steps of:

adding a total accumulated phase error for a path distance to symbol 1 to the accumulated phase error for a branch distance from symbol 1 at time period $T_{N-1}$ to symbol 0 at time period $T_N$;

comparing said accumulated phase error to the lowest path distance indicator for symbol 0 only;

determining whether said accumulated phase error is less than said lowest path distance indicator for symbol 0 only.

13. A symbol state trellis maximum likelihood detection method as claimed in claim 12, wherein said step of determining an error of total Euclidean path distances further includes the steps of:

incrementing or decrementing said value of symbol 1 by said predetermined number, so that the value of symbol 1 corresponds to the next sequential symbol of said plurality of M symbols;

determining whether said value of symbol 1 is less than or equal to $M-1$ (greater than or equal to $-(M-1)$; and iterating said steps of claims 12 through 14, when said value of symbol 1 is less than or equal to $M-1$.

14. A symbol state trellis maximum likelihood detection method as claimed in claim 13, where said step of determining an error of total Euclidean path distances further includes the steps of:

normalizing each of said path distances to the value of symbol 0 based upon said lowest path distance indicator for symbol 0 only;

adding the path distance from symbol 1 to symbol 0 to the previous path to symbol 1;

saving the added path distance; and comparing the lowest path distance indicator for symbol 0 only to the lowest path distance indicator for all symbols.

15. A symbol state trellis maximum likelihood detection method as claimed in claim 14, said step of determining an error of total Euclidean path distances further including the step of determining whether said lowest path distance indicator for symbol 0 is less than the lowest path distance indicator for all symbols.

16. A symbol state trellis maximum likelihood detection method as claimed in claim 15, wherein further included the steps of:

incrementing or decrementing said value of symbol 0 by said predefined number, so that the value of symbol 0 corresponds to next sequential symbol of said plurality of M symbols;

determining whether said value of symbol 0 is less than or equal to $M-1$ (greater than or equal to $-(M-1)$; and iterating said steps of claims 11 through 18, when said value of symbol 0 is less than or equal to $M-1$.

17. In a continuous phase modulation (CPM) system having M symbols and an intersymbol interference of L, a symbol state trellis maximum likelihood detection method for limiting the number of interfering symbols which are required for examination, said symbol state trellis maximum likelihood detection method comprising the steps of:

determining Euclidean branch distances for plurality of M symbols from a present time period $T_N$ to said plurality of M symbols at previous time periods $T_{N-1}$;

determining an error of total Euclidean path distances corresponding to each of said Euclidean branch distances for said plurality of M symbols from said present time period $T_N$ to said previous time period $T_{N-1}$; and detecting symbols received by retracing said Euclidean path distances corresponding to said minimum error for M time periods from said symbol at said time period $T_N$ having a minimal phase error.

18. In a continuous phase modulation (CPM) system having M symbols and an intersymbol interference of L, a symbol state trellis maximum likelihood detection method for limiting the number of interfering symbols which are required for examination, said symbol state trellis maximum likelihood detection method comprising the steps of:

determining Euclidean branch distances for a plurality of M symbols from a present time period $T_N$ to said plurality of M symbols at a previous time period $T_{N-1}$;

determining an error of total Euclidean path distances corresponding to each of said Euclidean branch distances for said plurality of M symbols from said present time period $T_N$ to said previous time period $T_{N-1}$;

saving a particular path to each of said plurality of M symbols at time period $T_N$ from time period $T_{N-1}$, each of said particular paths corresponding to a minimum error of said total Euclidean path distances;

detecting symbols received by retracing said Euclidean path distances corresponding to said minimum error for M time periods from said symbol at time period $T_N$ having said minimum error;

said step of determining Euclidean branch distances includes the step of setting symbol 1, a symbol at time period $T_{N-1}$, with an initial symbol value of said plurality of M symbols;

said step of determining Euclidean branch distances further includes the steps of:
  looking-up a value of previously stored symbols prior to symbol 1;
  setting symbol N (for N greater than or equal to 2) equal to said value; and
  iterating said steps of looking-up and setting for L time periods;

said step of determining Euclidean branch distances further includes the step of setting symbol 0 said initial symbol value of said plurality of M symbols;

said step of determining Euclidean branch distances further includes the step of:
  clearing an accumulated phase indicator; and
  setting an indicator of a current sample to be that of a first sample;

said step of determining Euclidean branch distances further includes the steps of:
  finding a received phase for said current sample;
  looking-up an expected phase for said current sample;
  subtracting said expected phase from said phase of said current sample to produce a difference;
  determining the absolute value of said difference of said expected phase from said phase of said simple; and
  adding said absolute value to said accumulated phase indicator to produce an accumulated phase error;

said step of determining Euclidean branch distances further includes the steps of:
  incrementing a current sample count indicator;
  determining whether said current sample count indicator is less than or equal to a predetermined maximum sample counts per period; and
  iterating said steps of finding, looking-up, subtracting, determining, adding, incrementing, and determining, when said current sample count indicator is less than or equal to said predetermined maximum;

said step of determining Euclidean branch distances further includes the steps of:
  saving said accumulated phase error for each of said branch distances to symbol 0;
  incrementing or decrementing said value of symbol 0 by a predefined number, so that the value of symbol 0 corresponds to a next sequential symbol of said plurality of M symbols;
  determining whether said value of symbol 0 is less than or equal to $M-1$ (greater than or equal to $-(M-1)$; and
  iterating said steps of clearing, setting, finding looking-up, subtracting, determining, adding, incrementing, iterating, saving, incrementing, determining, and iterating, when said value of symbol 0 is less than or equal to $M-1$;

said step of determining Euclidean branch distances further includes the steps of:
  incrementing or decrementing said value of symbol 1 by said predefined number, so that the value of symbol 1 corresponds to said next sequential symbol of said plurality of M symbols;
  determining whether said value of symbol 1 is less than or equal to $M-1$ (greater than or equal to $-(M-1)$; and
  iterating said steps of clearing, setting, finding looking-up, subtracting, determining, adding, incrementing, iterating, saving, incrementing, determining, iterating, incrementing, and determining, when said value of symbol 1 is less than or equal to $M-1$;

said step of determining an error of total Euclidean path distances includes the steps of:
  setting a lowest path distance indicator for all symbols with a predetermined largest possible value; and
  setting said value of symbol 0 with said value of the largest negative symbol of said plurality of M symbols;

said step of determining an error of total Euclidean path distances further includes the steps of:
  setting a lowest path distance indicator for symbol 0 only with said largest possible value; and
  setting the value of symbol 1 with said value of the largest negative symbol of said plurality of M symbols;

said step of determining an error of total Euclidean path distances further includes the steps of:
  adding a total accumulated phase error for a path distance to symbol 1 to the accumulated phase error for a branch distance from symbol 1 at time period $T_{N-1}$ to symbol 0 at time period $T_N$;
  comparing said accumulated phase error to the lowest path distance indicator for symbol 0 only;
  determining whether said accumulated phase error is less than said lowest path distance indicator for symbol 0 only; and said step of determining an error of total Euclidean path distances further includes the steps of:
  setting said lowest path distance indicator for symbol 0 only with the smallest determined accumulated phase error for the path corresponding to symbol 0;
  saving said path distance from said previous symbol to symbol 0 as a new value for symbol 1; and
  omitting said steps of setting said lowest path distance and saving said path distance, when said accumulated phase error is greater than or equal to said lowest path distance indicator for symbol 0 only.

19. In a continuous phase modulation (CPM) system having M symbols and an intersymbol interference of L, a symbol state trellis maximum likelihood detection method for limiting the number of interfering symbols which are required for examination, said symbol state trellis maximum likelihood detection method comprising the steps of:
  determining Euclidean branch distances for a plurality of M symbols from a present time period $T_N$ to said plurality of M symbols at a previous time period $T_{N-1}$;
  determining an error of total Euclidean path distances corresponding to each of said Euclidean branch distances for said plurality of M symbols from said present time period $T_N$ to said previous time period $T_{N-1}$;
  saving a particular path to each of said plurality of M symbols at time period $T_N$ from time period $T_{N-1}$, each of said particular paths corresponding to a minimum error of said total Euclidean path distances;
  detecting symbols received by retracting said Euclidean path distances corresponding to said minimum error for M time periods from said symbol at time period $T_N$ having said minimum error;

said step of determining Euclidean branch distances includes the step of setting symbol 1, a symbol at time period $T_{N-1}$, with an initial symbol value of said plurality of M symbols;

said step of determining Euclidean branch distances further includes the steps of:
looking-up a value of previously stored symbols prior to symbol 1;
setting symbol N (for N greater than or equal to 2) equal to said value; and
iterating said steps of looking-up and setting for L time periods;

said step of determining Euclidean branch distances further includes the step of setting symbol 0 with said initial symbol value of said plurality of M symbols;

said step of determining Eucliden branch distances further includes the step of:
clearing an accumulated phase indicator; and
setting an indication of a current sample to be that of a first sample;

said step of determining Euclidean branch distances further includes the steps of:
finding a received phase for said current sample;
looking-up an expected phase for said current sample;
subtracting said expected phase from said phase of said current sample to produce a difference;
determining the absolute value of said difference of said expected phase from said phase of said simple; and
adding said absolute value to said accumulated phase indicator to produce an accumulated phase error;

said step of determining Euclidean branch distances further includes the steps of:
incrementing a current sample count indicator;
determining whether said current sample count indicator is less than or equal to a predetermined maximum sample counts per period; and
iterating said steps of finding, looking-up, subtracting, determining, adding, incrementing, and determining, when said current sample count indicator is less than or equal to said predetermined maximum;

said step of determining Euclidean branch distances further includes the steps of:
saving said accumulated phase error for each of said branch distances to symbol 0;
incrementing or decrementing said value of symbol 0 by a predetermined number, so that the value of symbol 0 corresponds to a next sequential symbol of said plurality of M symbols,
determining whether said value of symbol 0 is less than or equal to $M-1$ (greater than or equal to $-(M-1)$; and
iterating said steps of clearing, setting, finding looking-up, subtracting, determining, adding, incrementing, iterating, saving, incrementing, determining, and iterating, when said value of symbol 0 is less than or equal to $M-1$;

said step of determining Euclidean branch distances further includes the steps of:
incrementing or decrementing said value of symbol 1 by said predetermined number, so that the value of symbol 1 corresponds to said next sequential symbol of said plurality of M symbols;
determining whether said value of symbol 1 is less than or equal to $M-1$ (greater than or equal to $-(M-1)$; and
iterating said steps of clearing, setting, finding looking-up, subtracting, determining, adding, incrementing, iterating, saving, incrementing, determining, iterating, incrementing, and determining, when said value of symbol 1 is less than or equal to $M-1$;

said step of determining an error of total Euclidean path distances includes the steps of:
setting a lowest path distance indicator for all symbols with a predetermined largest possible value; and
setting said value of symbol 0 with said value of the largest negative symbol of said plurality of M symbols;

said step of determining an error of total Euclidean path distances further includes the steps of:
setting a lowest path distance indicator for symbol 0 only with said largest possible value; and
setting the value of symbol 1 with said value of the largest negative symbol of said plurality of M symbols;

said step of determining an error of total Euclidean path distances further includes the steps of:
adding a total accumulated phase error for a path distances to symbol 1 to the accumulated phase error for a branch distance from symbol 1 at time period $T_{N-1}$ to symbol 0 at time period $T_N$;
comparing said accumulated phase error to the lowest path distance indicator for symbol 0 only;
determining whether said accumulated phase error is less than said lowest path distance indicator for symbol 0 only; and said step of determining an error of total Euclidean path distances further includes the steps of:
setting said lowest path distance indicator for symbol 0 only with the smallest determined accumulated phase error for the path corresponding to symbol 0;
saving said path distance from said previous symbol to symbol 0 as a new value for symbol 1; and
omitting said steps of setting said lowest path distance and saving said path distance, when said accumulated phase error is greater than or equal to said lowest path distance indicator for symbol 0 only;

said step of determining an error of total Euclidean path distances further includes the steps of:
incrementing or decrementing said value of symbol 1 by said predetermined number, so that the value of symbol 1 corresponds to the next sequential symbol of said plurality of M symbols;
determining whether said value of symbol 1 is less than or equal to $M-1$ (greater than or equal to $-(M-1)$; and
iterating said steps of adding, comparing, determining, incrementing, and determining, when said value of symbol 1 is less than or equal to $M-1$;

said step of determining an error of total Euclidean path distances further includes the steps of:
normalizing each of said path distances to the value of symbol 0 based upon said lowest path distance indicator for symbol 0 only;

adding the path distance from symbol 1 to symbol 0 to the previous path to symbol 1;

saving the added path distance; and comparing the lowest path distance indicator for symbol 0 only to the lowest path distance indicator for all symbols;

said step of determining an error of total Euclidean path distances further including the step of determining whether said lowest path distance indicator for symbol 0 is less than the lowest path distance indicator for all symbols;

said step of saving a particular path includes the steps of:

setting said lowest path distance indicator for all symbols equal to said lowest path distance indicator for symbol 0 only; and saving symbol 0 as the current symbol; and omitting said steps of setting said lowest path distance indicator and saving symbol 0, when said lowest path distance indicator for symbol 0 only is greater than or equal to the lowest path distance indicator for all symbols.

* * * * *